US008250314B2

(12) United States Patent
Mondello

(10) Patent No.: US 8,250,314 B2
(45) Date of Patent: Aug. 21, 2012

(54) METHOD AND DEVICE FOR CHECKING SECTOR PROTECTION INFORMATION OF A NON-VOLATILE MEMORY

(75) Inventor: Antonino Mondello, Messina (IT)

(73) Assignee: Micron Technology, Inc., Boise, ID (US)

(*) Notice: Subject to any disclaimer, the term of this patent is extended or adjusted under 35 U.S.C. 154(b) by 967 days.

(21) Appl. No.: 11/693,360

(22) Filed: Mar. 29, 2007

(65) Prior Publication Data

US 2007/0233984 A1 Oct. 4, 2007

(30) Foreign Application Priority Data

Mar. 29, 2006 (EP) .................................... 06425214

(51) Int. Cl.
*G06F 12/00* (2006.01)
*G06F 13/00* (2006.01)
*G06F 13/28* (2006.01)

(52) U.S. Cl. ........ 711/152; 711/103; 711/156; 711/163; 726/26

(58) Field of Classification Search .................. 711/103, 711/152, 156, 163; 726/26
See application file for complete search history.

(56) References Cited

U.S. PATENT DOCUMENTS

| | | | | |
|---|---|---|---|---|
| 5,631,847 | A * | 5/1997 | Kikinis | 709/207 |
| 5,712,861 | A * | 1/1998 | Inoue et al. | 714/752 |
| 5,764,653 | A * | 6/1998 | Wuidart | 714/718 |
| 5,930,826 | A * | 7/1999 | Lee et al. | 711/163 |
| 6,490,197 | B1 * | 12/2002 | Fasoli | 365/185.04 |
| 6,731,536 | B1 * | 5/2004 | McClain et al. | 365/185.04 |
| 7,054,990 | B1 * | 5/2006 | Tamura et al. | 711/103 |
| 2003/0117844 | A1 * | 6/2003 | Kawamata | 365/185.04 |
| 2004/0059906 | A1 * | 3/2004 | Park et al. | 713/2 |
| 2005/0276125 | A1 * | 12/2005 | Kido et al. | 365/189.05 |

* cited by examiner

*Primary Examiner* — Stephen Elmore
*Assistant Examiner* — Mark Giardino, Jr.
(74) *Attorney, Agent, or Firm* — Leffert Jay & Polglaze, P.A.

(57) ABSTRACT

A non-volatile memory device includes addressable sectors and an ancillary volatile memory array. The ancillary volatile memory array stores protection information in the addressable sectors that is not accessible to users of the memory. The protection information is downloaded in the memory array at every power-on of the memory device. The memory array includes at least two additional columns containing preset logic information physically adjacent to the columns containing the downloaded information. A logic circuit is input with the logic information read from the additional check columns for checking the integrity of the preset logic information content of the check columns. An integrity check signal is output by the logic circuit.

23 Claims, 4 Drawing Sheets

METHOD AND DEVICE FOR CHECKING SECTOR PROTECTION INFORMATION OF A NON-VOLATILE MEMORY

FIELD OF THE INVENTION

The present invention relates to non-volatile memory devices having a plurality of addressable sectors and an ancillary volatile memory array, and more particularly, to techniques for revealing corruption of stored volatile data in the ancillary memory array and preventing unauthorized modification of non-volatile data stored in protected sectors of the memory device.

BACKGROUND OF THE INVENTION

Protection techniques for non-volatile stored data may be of two types. A first type is the relatively unburdensome storing of volatile protection information. This is the generally adopted technique for preventing accidental alterations by the users of the permanently stored information in the memory device. A second type is a far more burdensome storing of non-volatile protection information. This is where a dedicated inaccessible memory region becomes inevitable when, beside prevention of accidental alterations by authorized users of the stored data, the stored data needs to be protected from malicious deliberate actions by hackers and alike.

Non-volatile protection systems are far more critical to design because they need to resist deliberate hacker attempts to alter the content of a programmed non-volatile memory device or sector thereof to illegally enable the use of set top boxes, cellular phones and other mobile personal apparatuses. FIG. 1 schematically depicts a volatile memory array on which sector protection information is stored, and FIG. 2 schematically depicts a possible fraudulent modification of protection information stored in the volatile memory array.

A survey of relevant technical literature confirms that integrity of stored data is generally based on the use of non-volatile memory elements (flash cells) in which the state of protection of the different sectors of the memory device is recorded. The protection system imposes verification of the state of protection of the addressed sector before enabling any modification of data stored in it (programming or erasing operations). Such a verification is done by reading a dedicated or reserved region of non-volatile memory containing protection information on the distinct sectors that are not accessible to the user of the memory device. This ensures robustness of the protection system because the protection information recorded in the inaccessible non-volatile memory region is inalterable from outside or external the memory.

Protection information and other vital information can be written in such a reserved region of the non-volatile memory cell array, inaccessible to any external user, exclusively by an internal controller of the memory device.

However, the implementation of such a data protection system imposes significant architectural restraints to the non-volatile memory device. To overcome these restraints, it is possible at the expense of a non-negligible increment of circuit complexity and of the silicon area required for realizing the required additional circuitry.

For instance, implementation of a non-volatile protection system in dual-job flash memory devices, the inaccessible non-volatile memory region intended to store the protection information needs to be provided with dedicated read and write/erase circuitry. The non-volatile flash memory devices are capable of simultaneously reading data from one sector while being engaged in modifying data on a different sector of the memory. This is in view of the fact that it is difficult to exploit the same circuitries of the ordinary data storing sectors of the memory device addressable by an external user without jeopardizing the dual-job capability.

SUMMARY OF THE INVENTION

In view of the foregoing background, an object of the present invention is to overcome the above noted drawbacks without affecting the intrinsic robustness against hacker attacks offered by a protection system based on the use of inaccessible non-volatile memory elements for safely storing protection information.

This and other objects, advantages and features are fully achieved by a method and relative implementing structure in accordance with the present invention without any substantial increase of circuit complexity and in the silicon area being occupied.

The usual presence in any multi-sector non-volatile memory device of a volatile memory array, that may be a static RAM (or latch) array or even a dynamic PAM array requiring periodic refresh, may be exploited for other operating purposes of the non-volatile memory device. This is typically for providing read and write cache memory capabilities to reduce access time in reading data from the sectors of the non-volatile memory array, and for reducing the time needed for writing large amounts of data in the non-volatile memory array sectors.

Sector protection information permanently stored in a dedicated inaccessible region of the non-volatile memory cell array may be copied (downloaded) at every power-on in either a purposely realized volatile latch array of an appropriate size or in a volatile memory array of a relatively large size useful also for other purposes. However, differently from commonly known volatile type protection arrangements, actions that could be done by a hacker for altering the data on the protection state of the addressable sectors of the non-volatile memory array that are stored in a volatile manner in order to become able to fraudulently modify the permanently stored data are prevented.

Typically, one way a hacker could defeat a protection system based on stored volatile sector protection state information is to artificially lower the supply voltage of the memory device as far down as possible for causing the loss of information on the sector protection by the latches of the volatile memory array, and raising again the supply voltage to its nominal value. This would allow the hacker to be free to alter the data stored in the sectors of the non-volatile memory array.

A reliable manner of rendering any intervened corruption (modification) of any data that is downloaded at power-on of the device in a certain ancillary volatile memory array and inhibiting any modification of data stored in the non-volatile memory sectors provides an insurmountable obstacle to fraudulent attempts.

Basically, the method of protecting addressable sectors of a non-volatile memory device including an ancillary volatile memory array, for preventing illicit or unauthorized modification of stored non-volatile data by an external user, comprises the steps of storing protection information on the addressable sectors of the non-volatile memory device in a dedicated non-volatile memory space inaccessible to external users of the device. The permanently stored protection information is checked whenever modification of data stored in a certain memory sector is attempted.

The method may further comprise reading the permanently stored protection information from the inaccessible non-volatile memory space at every power-on of the device, and copying it in the ancillary volatile memory array including at least two additional check columns containing preset logic information. Prior to modifying data stored in a memory sector, the method may comprise reading the protection information of the sector from the volatile memory array and the content of the check columns.

If the read content of the additional check columns matches the preset logic information, the read sector protection information is assumed true and the modification of data in the selected sector is allowed. If the read content of the check columns does not match the preset logic information, the event is signaled, data modification circuitry of the device is disabled and the permanently stored protection information is downloaded again from the inaccessible non-volatile memory space in the volatile memory array. This reestablishes therein the correct original protection information.

Preferably, the preset logic information recorded in the two additional check columns is complementary. That is, if one of the two columns contains zeroes the other column should contain ones in order not to privilege any logic level in relation to the integrity check of the recorded volatile preset logic information. The logic content of the two additional check columns may even be in the form of offset alternate sequences of zeroes and ones.

DETAILED DESCRIPTION OF THE PREFERRED EMBODIMENTS

Figure 1:
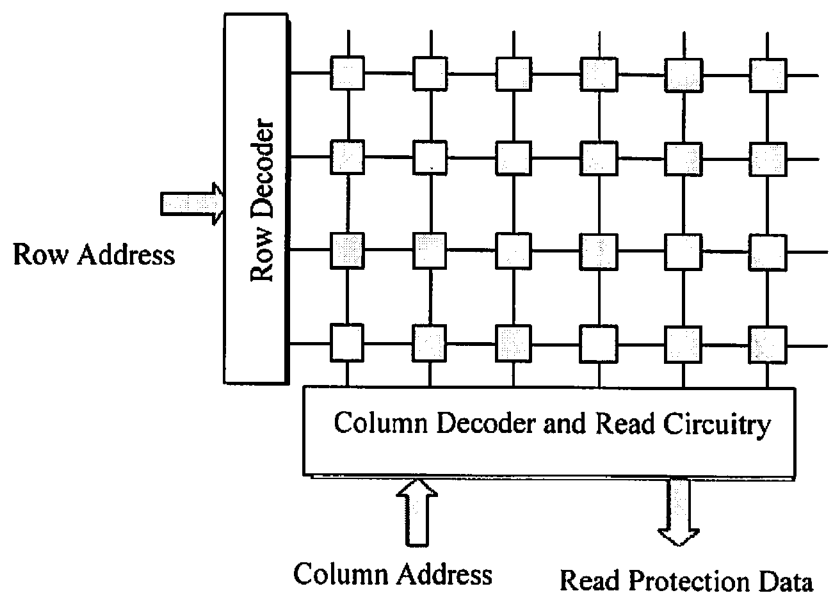
FIG. 1 schematically depicts a volatile memory array on which sector protection information is stored according to the prior art.
Figure 2:
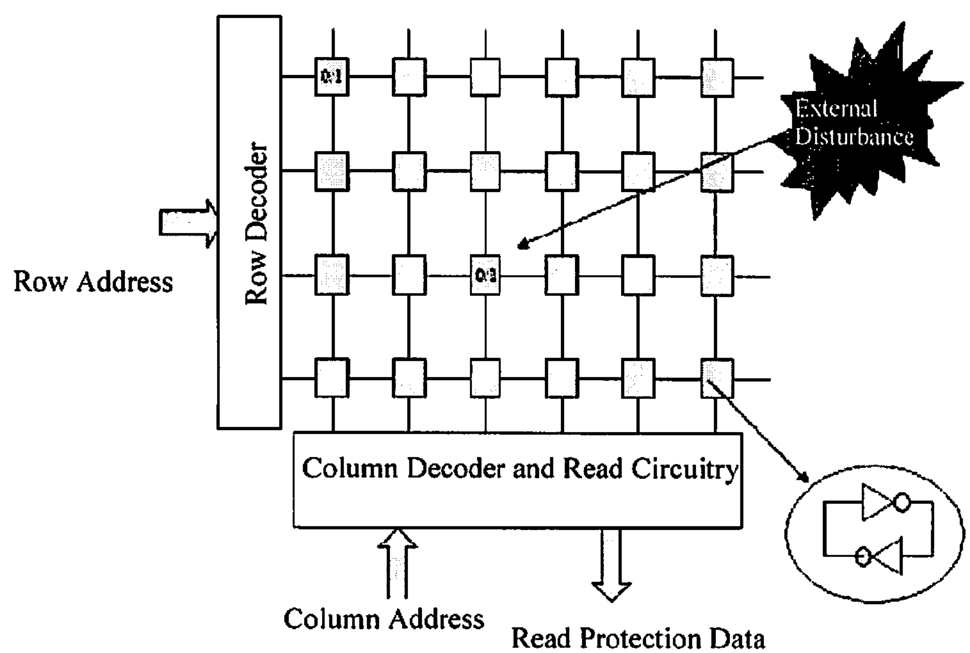
FIG. 2 schematically depicts a possible fraudulent modification of protection information stored in the volatile memory array according to the prior art.
Figure 3:
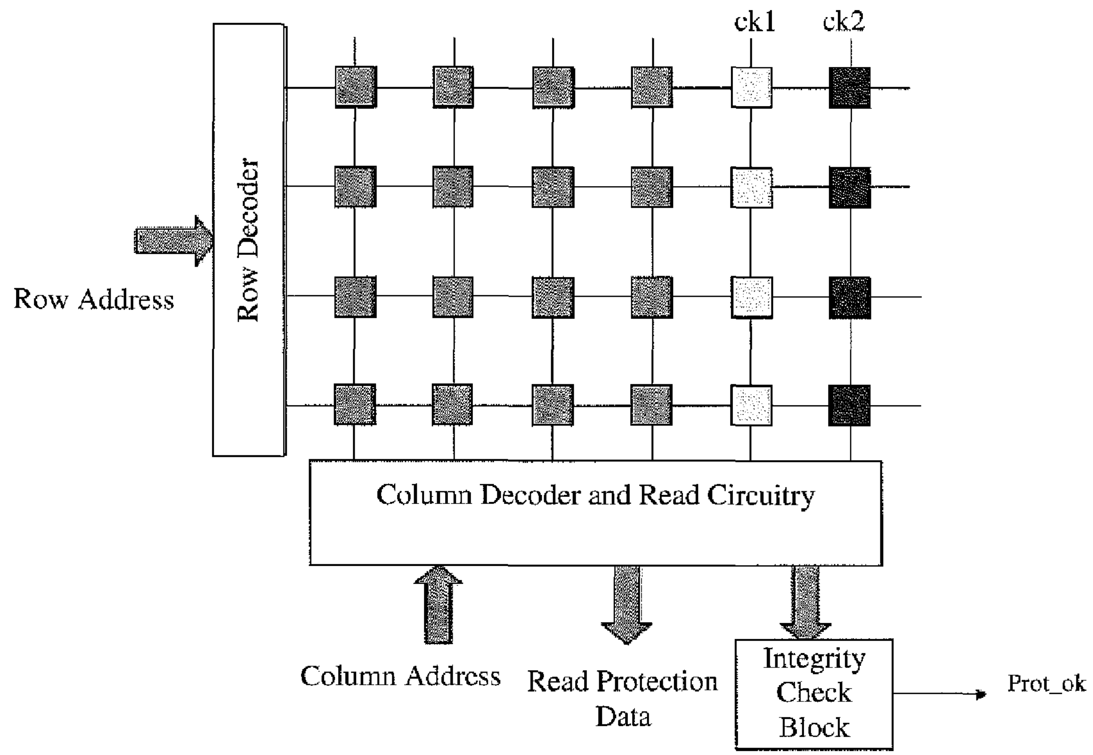
FIG. 3 is a diagram of a volatile memory array for storing sector protection information modified according to the present invention.

FIG. 3 shows a basic embodiment of the memory in accordance with the present invention. The volatile memory array in which sector protection information is stored at every power-on of the device includes two additional columns ck1 and ck2 that according to this embodiment are at the right side of the volatile array region in which the protection state of the various sectors of the non-volatile memory device are stored. The volatile memory array includes as customary a row decoder, a column decoder and relative read circuitry.

The values read from the two added columns, ck1 and ck2, are checked by the integrity check block that eventually generates a protection integrity signal Prot_ok. As noted above, the preset logic content of additional check columns ck1 and ck2 may preferably be complementary. In the shown example, one of the two columns ck1 contains zeroes while the other column ck2 contains ones in order not to privilege any of the two logic levels.

Before modifying any data in any of the addressable sectors of the non-volatile memory device, the system reads the state of protection of the addressed sector in which data should be modified from the protection information stored in the volatile memory array of FIG. 3. And besides the protection information, the contents of the two additional check columns ck1 and ck2 are also read. If the logic result corresponds to the preset logic information introduced in the two additional check columns ck1 and ck2, the sector protection information read is considered reliable. Therefore, the modification of data stored in the device can proceed.

Figure 4:
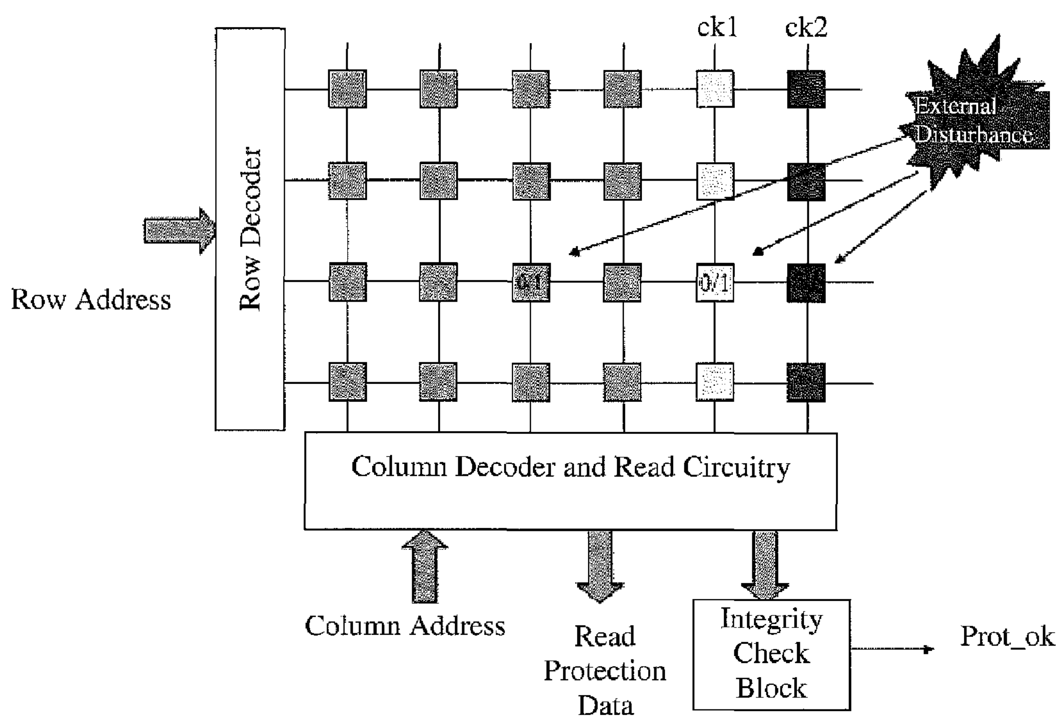
FIG. 4 schematically depicts a possible fraudulent modification of protection information stored in the modified volatile memory array of FIG. 3.

In contrast, should for any reason the logic information read from the two additional check columns ck1 and ck2 differ from the preset logic information, as schematically depicted in FIG. 4, the integrity check block detects deformity because of an intervened modification of the logic content of the volatile memory cells of the two check columns ck1 and ck2. It will disable the check signal Prot_ok.

Disabling of the check signal Prot_ok will in turn cause the disabling of the data modification circuitry of the non-volatile memory device. This will command a new downloading (copying) in the volatile memory array of the sector protection information from the inaccessible non-volatile memory space that contains the correct original protection information, and the writing of the preset logic information in the additional check columns ck1 and ck2.

Of course, such an intervention will normally not occur during an unauthorized use of the non-volatile memory device. Thus, the user will not encounter any delay or limitation in the use of the memory device.

Figure 5:
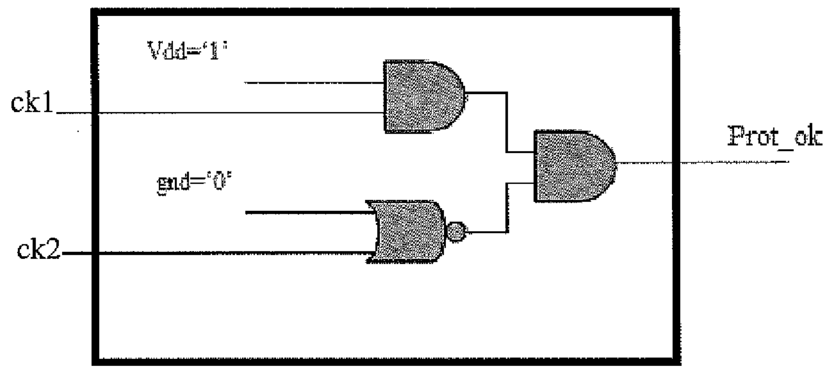
FIG. 5 shows a circuit implementation of the check block of FIGS. 3 and 4.

FIG. 5 shows a possible circuit implementation of the function of the integrity check block of FIGS. 3 and 4 for the case of a basic implementation of the method wherein in one check column all logic ones are introduced and in the other check column all zeroes are introduced. The circuit diagram and symbols used for generating the check signal Prot_ok are easily recognizable by those skilled in the art. The check signal Prot_ok will remain active if the preset logic pattern of the cells of the two additional check columns ck1 and ck2 correspond to the above-mentioned logic content, and will eventually be disabled based on an occurrence as depicted in FIG. 4. Here, a cell of the first check column ck1 that should contain a zero and the adjacent cell of column ck2 on the same row that should contain a logic one are found to be in an improper logic state.

Figure 6:
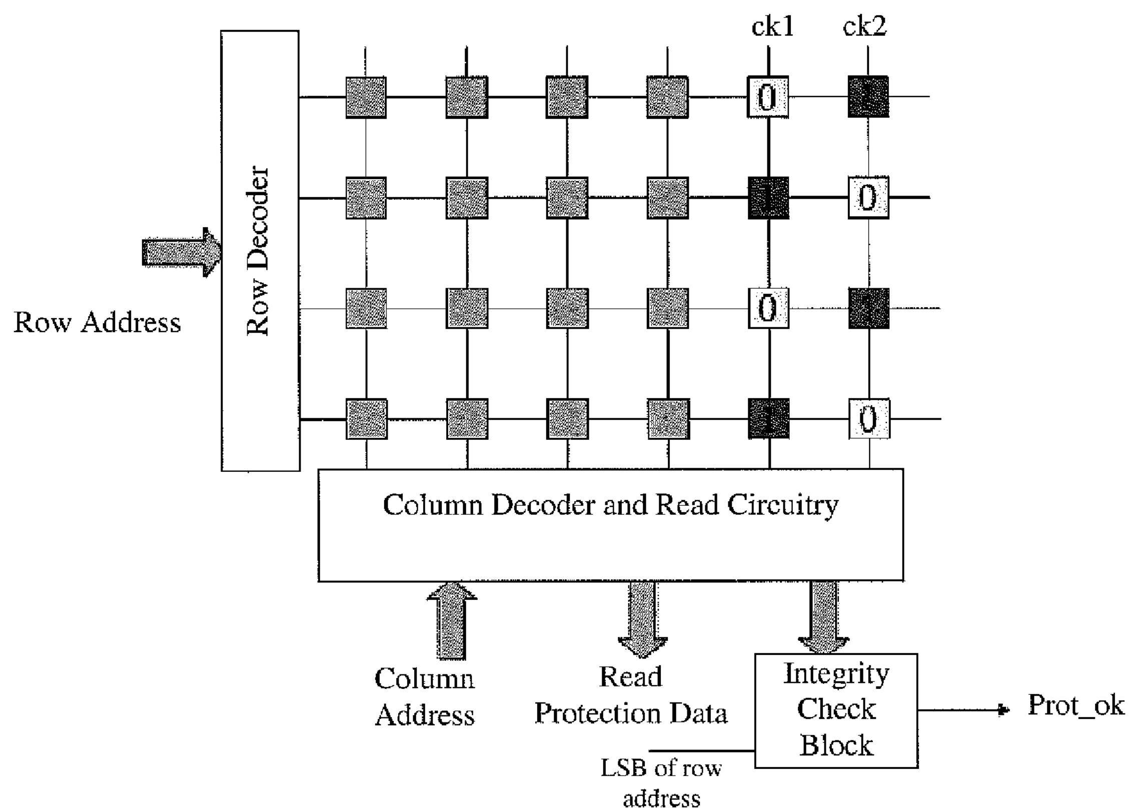
FIG. 6 shows a way of enhancing the reliability of the integrity check according to the present invention.

To enhance robustness of the integrity check, the preset logic information introduced in the two additional check columns ck1 and ck2 may be an alternating sequence of zeroes and ones, for example starting on a even numbered column with a 0 and starting an odd numbered column with a 1, as in the example shown in FIG. 6, or vice-versa.

Figure 7:
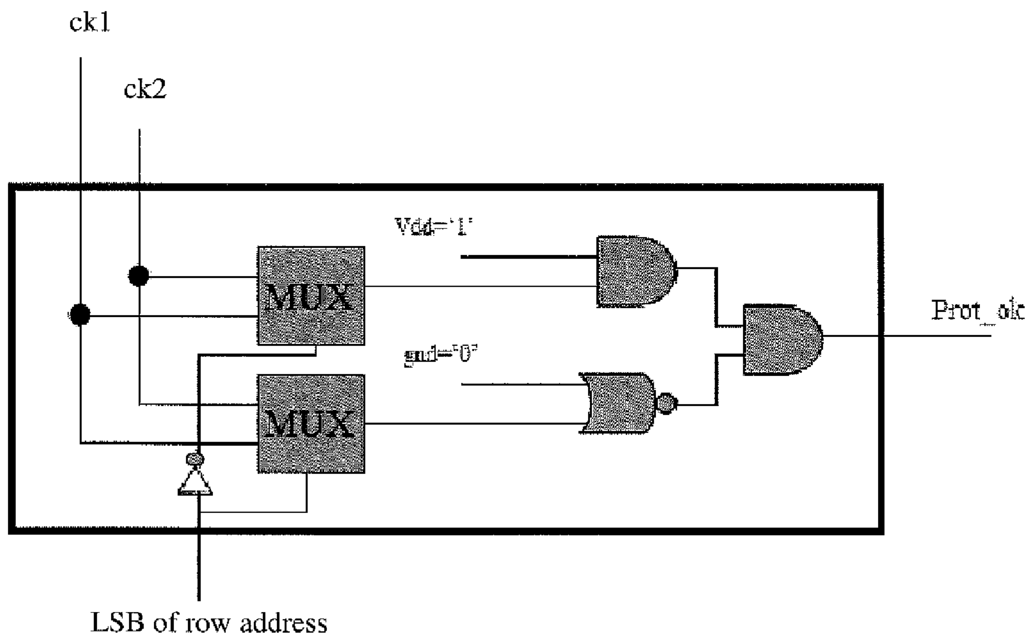
FIG. 7 shows how the circuit implementation of the logic for checking the integrity of the stored volatile protection information can be modified to support the enhanced robustness implementation of the embodiment of FIG. 6.

According to this alternate embodiment, the integrity check circuitry of the common blocks need to take into account from which row the pair of read values come from. This may be implemented by monitoring the value of the least significant bit of the row address of the sector protection data array. A possible circuit embodiment of such an integrity check logic circuit is depicted in FIG. 7.

As will be readily understood by those skilled in the art, the operation is similar to that of the circuit of FIG. 5 with the only difference being the introduction of an input stage composed of two multiplexers (MUX) that have the function of selecting the signal path of logic the values read from the check columns containing zeroes or ones depending on the addressed row (even or odd).

In case the memory device in which the method is to be implemented has sector protection data that can be contained in a volatile memory array of relatively large dimensions, it may be necessary to introduce two or even more pairs of additional check columns. This is to ensure that even locally effective actions leading to localized alterations of the logic content of the volatile memory cells in which the sector protection information is downloaded at every power-on will be sensed by at least one of the distributed pairs of check columns.

Figure 8:
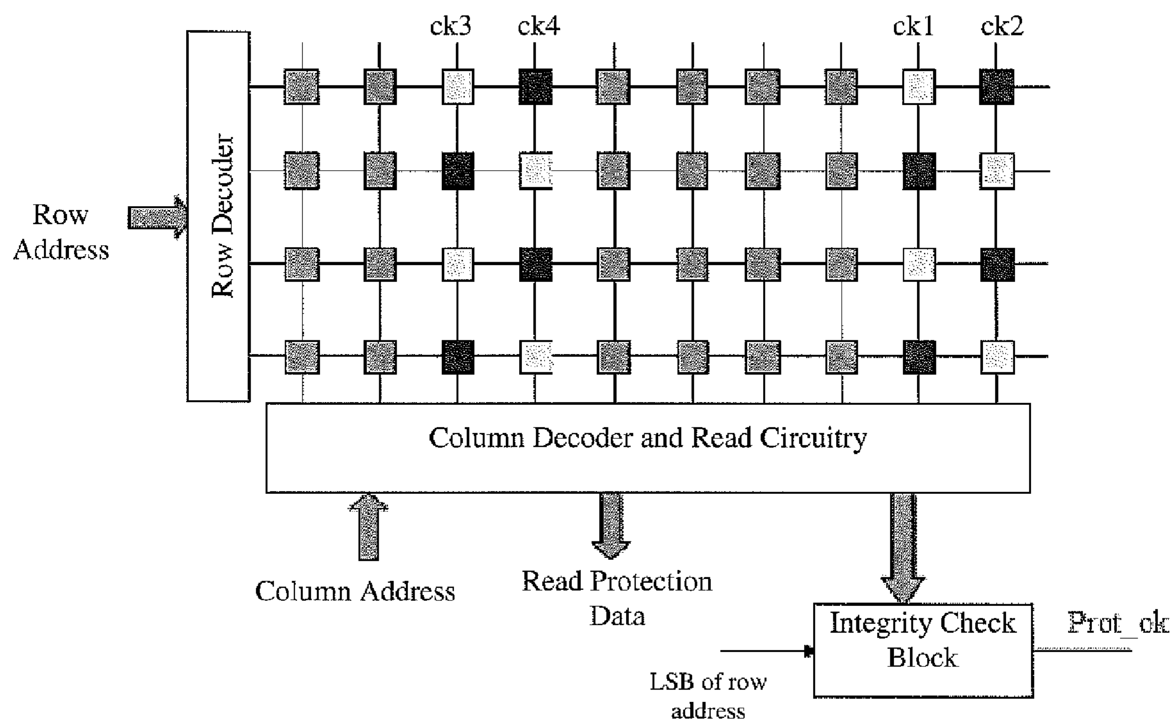
FIG. 8 shows an alternative implementation of the method according to the present invention.

FIG. 8 illustrates such an alternative embodiment employing two pairs of check columns, ck1-ck2 and ck3-ck4, respectively. Naturally, the integrity check block will in this case need to include an appropriate logic check circuit, replicated or specific, for each pair of check columns. Even in this embodiment, it will be possible to choose for all or for each pair of check columns a certain pattern of preset logic information. The appropriate logic check circuits for each pair of check columns are also provided.

Preserving unaltered the intrinsic robustness against hacker's attacks of sector protection information stored in an inaccessible non-volatile memory space achieves the following important advantages. The sector protection information may be stored in a non-volatile memory array partition common to those of the addressable data storing sectors of the memory device because. This is in view of the fact that access to the stored non-volatile sector protection information is not contemplated to occur during an unauthorized use of the device. It is no longer necessary to form a dedicated read circuit. The only access to the stored non-volatile sector protection information occurs at power-on of the memory device.

Greater speed and a reduced complexity of the data modification algorithms are also achieved because access to a volatile memory array is simpler and quicker. The time for reading the state of protection of a sector is significantly less than an access time to the volatile memory space. A significant saving of silicon area is achieved by not requiring the realization of dedicated read circuitry of the reserved non-volatile memory space.

Moreover, besides reaching the primary objectives of providing a less burdensome implementation of and faster performing sector protection, the practical embodiment provides also circuit structures that are capable of effectively detecting and revealing a possible corruption that may have occurred of any stored volatile data in the ancillary memory array to which the pair or pairs of check columns with a preset logic content are associated.

As noted, other vital information for the correct functioning of the memory device, besides the sector protection information, may be downloaded at power-on in the ancillary volatile memory array. Even not out of a deliberate hacker attack, other environmental conditions such as strong electromagnetic fields may corrupt the recorded volatile data. A periodic integrity check of the preset logic content of the check columns will reveal the possibility that data may have been corrupted, and command a new downloading (refresh) of the data from the reserved non-volatile memory region where they permanently reside.

That which is claimed:

1. A method comprising:

reading protection information, which corresponds to a sector of non-volatile memory and indicates whether data stored in the corresponding sector of non-volatile memory is modifiable, from an ancillary volatile memory array, and reading check information from at least two check columns of the ancillary volatile memory array;

comparing, with an integrity check block, the check information to preset logic information to determine whether the check information has a particular set of values;

allowing the data stored in the corresponding sector of non-volatile memory to be modified according to the protection information when the check information has the particular set of values; and preventing the data stored in the corresponding sector of non-volatile memory from being modified when the check information has any set of values other than the particular set of values.

2. The method of claim 1, wherein preventing the data stored in the corresponding sector of non-volatile memo from being modified when the check information has any set of values other than the particular set of values comprises disabling a data modification circuit, with respect to a modification command pertaining to the sector, when the check information has any set of values other than the particular set of values.

3. The method of claim 1, further comprising, when the check information has any set of values other than the particular set of values, copying the protection information from another sector of the nonvolatile memory, which is inaccessible to external users, to the ancillary volatile memory and copying the preset logic information to the at least two check columns of the ancillary volatile memory array from the another sector of the nonvolatile memory.

4. The method of claim 1, further comprising storing the preset logic information in the at least two check columns, wherein the preset logic information includes a pair of complementary logic values stored in each row of the ancillary volatile memory.

5. The method of claim 4, wherein the logic values in each of the at least two check columns are arranged in an alternating sequence.

6. The method of claim 4, wherein the preset logic information corresponding to each row of the ancillary volatile memory that has a row address with a common least significant bit includes identical logic values.

7. The method of claim 1, wherein the at least two check columns comprises a plurality of pairs of check columns to store the check information, the plurality of pairs of check columns being spatially distributed among columns of the ancillary volatile memory.

8. The method of claim 1, wherein the sector of non-volatile memory is a first sector of non-volatile memory and the method further comprises copying, at power on, protection information and check information from a second sector of the non-volatile memory to the ancillary volatile memory array.

9. A memory device comprising:

at least one addressable sector;

at least one ancillary volatile memory array to store protection information, which corresponds to the at least one addressable sector and indicates whether the at least one addressable sector is modifiable, and check information, the at least one ancillary volatile memory array having at least two check columns to store the check information; and an integrity check block to be input with preset logic information and the check information stored in the at least two check columns;

wherein the integrity check block is configured to compare the check information to the preset logic information to determine whether the check information has a particular set of values;

wherein the memory device is configured to allow data stored in the at least one addressable sector to be modified according to the protection information when the check information has the particular set of values; and wherein the memory device is configured to prevent the data stored in the at least one addressable sector from being modified when the check information has any set of values other than the particular set of values.

10. The memory device of claim 9 wherein the integrity check block is configured to output an integrity check signal when the check information has the particular set of values.

11. The memory device of claim 10, further comprising a data modification circuit configured to receive the integrity check signal output from integrity check block and to modify the data stored in the at least one addressable sector according to the protection information.

12. The memory device of claim 10, further comprising a region of non-volatile memory, which is inaccessible to external users, to store protection information and preset logic information, wherein the protection information and preset logic information is copied from the region to the at least one ancillary volatile memory array when the check information has any set of values other than the particular set of values.

13. The memory device of claim 9, wherein the preset logic information, when stored in said at least two check columns, includes a pair of complementary logic values for each row of the at least one ancillary volatile memory array.

14. The memory device of claim 13, wherein the logic values in each of the at least two check columns are arranged in an alternating sequence.

15. The memory device of claim 13, wherein the preset logic information, when stored in said at least two check columns, includes identical logic values for each row of the ancillary volatile memory that has a row address with a common least significant bit.

16. The memory device of claim 9, wherein said at least two check columns comprises a plurality of pairs of check columns to store the preset logic information, said plurality of pairs of check columns being spatially distributed among columns of said at least one ancillary volatile memory array.

17. A memory device comprising:

a sector of non-volatile memory configured to store data;

an ancillary volatile memory having a first portion and a second portion, the first portion configured to store protection information that corresponds to the sector of non-volatile memory and that indicates whether the data stored in the sector of non-volatile memory is modifiable, and the second portion configured to store check information;

an integrity check block coupled to the ancillary volatile memory and configured to receive the check information from the ancillary volatile memory and to output compare the check information to preset logic information to determine whether the check information has a particular set of values;

wherein the memory device is configured to allow the data stored in the sector of non-volatile memory to be modified according to the protection information when the check information has the particular set of values; and wherein the memory device is configured to prevent the data stored in the sector of non-volatile memory from being modified when the check information has any set of values other than the particular set of values.

18. The memory device of claim 17, further comprising a data modification block configured to modify the data stored in the sector of non-volatile memory according to the protection information when the memory device allows the data stored in the sector of non-volatile memory to be modified according to the protection information.

19. The memory device of claim 17, further comprising a controller configured to load the protection information and the preset logic information from another sector of the non-volatile memory to the ancillary volatile memory at power-on of the memory device.

20. The memory device of claim 17, further comprising a controller configured to load the protection information and the preset logic information from another sector of the non-volatile memory to the ancillary volatile memory when the check information has any set of values other than the particular set of values.

21. The memory device of claim 19, wherein the preset logic information, when stored in the second portion, includes a pair of complementary logic values for each row of the second portion.

22. The memory device of claim 21, wherein the second portion includes a pair of check columns to store the pairs of complementary logic values, wherein a first column of the pair of check columns provides an alternating pattern of logic values when the preset logic information is stored in the second portion.

23. The memory device of claim 17, wherein the second portion includes one or more pairs of check columns.

* * * * *

UNITED STATES PATENT AND TRADEMARK OFFICE

CERTIFICATE OF CORRECTION

PATENT NO. : 8,250,314 B2
APPLICATION NO. : 11/693360
DATED : August 21, 2012
INVENTOR(S) : Antonino Mondello It is certified that error appears in the above-identified patent and that said Letters Patent is hereby corrected as shown below:

In column 6, line 18, in Claim 2, delete “memo” and insert -- memory --, therefor.

In column 8, line 7, in Claim 17, after “memory and to” delete “output”.

Signed and Sealed this
Twenty-third Day of October, 2012

David J. Kappos
*Director of the United States Patent and Trademark Office*